(12) United States Patent
Koeck et al.

(10) Patent No.: US 10,704,160 B2
(45) Date of Patent: Jul. 7, 2020

(54) SAMPLE STAGE/HOLDER FOR IMPROVED THERMAL AND GAS FLOW CONTROL AT ELEVATED GROWTH TEMPERATURES

(71) Applicant: Arizona Board of Regents on Behalf of Arizona State University, Scottsdale, AZ (US)

(72) Inventors: Franz A. Koeck, Tempe, AZ (US); Robert J. Nemanich, Scottsdale, AZ (US)

(73) Assignee: ARIZONA BOARD OF REGENTS ON BEHALF OF ARIZONA STATE UNIVERSITY, Scottsdale, AZ (US)

(*) Notice: Subject to any disclaimer, the term of this patent is extended or adjusted under 35 U.S.C. 154(b) by 283 days.

(21) Appl. No.: 15/591,671

(22) Filed: May 10, 2017

(65) Prior Publication Data
US 2020/0173014 A1    Jun. 4, 2020

Related U.S. Application Data

(60) Provisional application No. 62/334,281, filed on May 10, 2016.

(51) Int. Cl.
*C30B 25/12* (2006.01)
*C30B 25/10* (2006.01)
(Continued)

(52) U.S. Cl.
CPC ............ *C30B 25/10* (2013.01); *C30B 25/12* (2013.01); *C23C 16/00* (2013.01); *C23C 16/44* (2013.01);
(Continued)

(58) Field of Classification Search
CPC ......... C30B 25/00; C30B 25/02; C30B 25/10; C30B 25/12; Y10T 117/00; Y10T 117/10;
(Continued)

(56) References Cited

U.S. PATENT DOCUMENTS

| 4,752,713 A | 6/1988 | Buxbaum |
| 5,234,724 A | 8/1993 | Schmidt |

(Continued)

FOREIGN PATENT DOCUMENTS

| EP | 2884525 A1 | 6/2015 |
| WO | 2014105085 A1 | 7/2014 |

OTHER PUBLICATIONS

Baumann, P.K. "Surface cleaning, electronic states and electron affinity of diamond (100), (111) and (110) surfaces", Surface Science 409, pp. 320-355 (1998).
(Continued)

*Primary Examiner* — Kenneth A Bratland, Jr.
(74) *Attorney, Agent, or Firm* — Withrow & Terranova, P.L.L.C.

(57) ABSTRACT

Apparatuses and methods are provided for manufacturing diamond electronic devices. The apparatus includes a base comprising a water-block and a cover that at least partially covers the water-block. The apparatus includes a sample stage disposed on the base. The apparatus further includes a sample holder disposed on the sample stage and configured to accept a diamond substrate. The apparatus includes controlled thermal interfaces between water-block, sample stage, sample holder and diamond substrate.

20 Claims, 18 Drawing Sheets

(51) Int. Cl.
   C23C 16/46      (2006.01)
   C30B 25/02      (2006.01)
   C23C 16/44      (2006.01)
   C23C 16/00      (2006.01)
   C30B 25/00      (2006.01)

(52) U.S. Cl.
   CPC ............ *C23C 16/46* (2013.01); *C23C 16/463* (2013.01); *C23C 16/466* (2013.01); *C30B 25/00* (2013.01); *C30B 25/02* (2013.01); *Y10T 117/00* (2015.01); *Y10T 117/10* (2015.01); *Y10T 117/1016* (2015.01)

(58) Field of Classification Search
   CPC ... Y10T 117/1016; C23C 16/00; C23C 16/44; C23C 16/46; C23C 16/463; C23C 16/466
   USPC .......... 117/84–86, 88–89, 92, 103, 105, 108, 117/200, 204, 928–929; 118/715, 722, 118/724–725, 728
   See application file for complete search history.

(56) References Cited

U.S. PATENT DOCUMENTS

| | | | |
|---|---|---|---|
| 5,551,903 A | | 9/1996 | Kumar et al. |
| 5,567,267 A | * | 10/1996 | Kazama ................. H01J 37/32 156/345.27 |
| 5,578,886 A | | 11/1996 | Homlid et al. |
| 5,631,196 A | | 5/1997 | Kane et al. |
| 5,635,258 A | | 6/1997 | Chen et al. |
| 5,944,573 A | | 8/1999 | Mearini et al. |
| 5,961,717 A | | 10/1999 | Kamo et al. |
| 6,129,047 A | * | 10/2000 | Nakamura .......... C23C 16/4412 118/500 |
| 6,179,924 B1 | * | 1/2001 | Zhao ..................... C23C 16/14 118/725 |
| 6,489,704 B1 | | 12/2002 | Kucherov et al. |
| 6,563,256 B1 | | 5/2003 | Zavadil et al. |
| 6,582,513 B1 | | 6/2003 | Linares et al. |
| 7,662,441 B2 | | 2/2010 | Gicquel et al. |
| 8,075,359 B2 | | 12/2011 | Yamada et al. |
| 8,188,456 B2 | | 5/2012 | Nemanich et al. |
| 8,277,622 B2 | | 10/2012 | Scarsbrook |
| 8,617,651 B2 | | 12/2013 | Fox et al. |
| 8,876,973 B2 | | 11/2014 | Kato et al. |
| 8,878,190 B2 | | 11/2014 | Suzuki et al. |
| 2003/0001490 A1 | | 1/2003 | Yamamoto et al. |
| 2003/0198005 A1 | * | 10/2003 | Sago ....................... B23Q 3/154 361/234 |
| 2005/0110024 A1 | | 5/2005 | Swain |
| 2005/0183669 A1 | * | 8/2005 | Parkhe ................ H01L 21/6831 118/724 |
| 2007/0234960 A1 | * | 10/2007 | Honda ................. C23C 16/4401 118/723 E |
| 2007/0284255 A1 | | 12/2007 | Gorokhovsky |
| 2008/0042144 A1 | | 2/2008 | Tatsumi et al. |
| 2012/0135575 A1 | | 5/2012 | Wong et al. |
| 2012/0248550 A1 | | 10/2012 | Huang et al. |
| 2015/0059974 A1 | | 3/2015 | Boyd, Jr. |
| 2015/0104648 A1 | | 4/2015 | Wang |
| 2015/0329989 A1 | | 11/2015 | Konovalov |
| 2015/0349060 A1 | | 12/2015 | Suzuki et al. |
| 2016/0043260 A1 | | 2/2016 | Nemanich et al. |

OTHER PUBLICATIONS

Corbella, C. et al., "Low friction and protective diamond-like carbon coatings deposited by asymmetric bipolar pulsed plasma", Diamond and Related Materials 18, pp. 1035-1038 (2009).

Dutta, M. et al., "P-i-n diodes enabled by homoepitaxially grown phosphorus doped diamond with breakdown electric field >1.25 MV/cm", 2015 73rd Annual Device Research Conference (DRC), Jun. 21-24, pp. 184—(2015).

Janssen, W. et al., "Substitutional phosphorus incorporation in nanocrystalline CVD diamond thin film", Phys. Status Solidi RRL 8, No. 8, 705-709 (2014).

Kato, H. et al., "Characterization of specific contact resistance on heavily phosphorus-doped diamond films", Diamond & Related Materials 18, pp. 782-785 (2009).

Kato, H. et al., "Heavily phosphorus-doped nano-crystalline diamond electrode for thermionic emission application", Diamond & Related Materials 63, pp. 165-168 (2016).

Kato, H. et al., "n-type diamond growth by phosphorus doping on (0 0 1)-oriented surface", J. Phys. D: Appl. Phys. 40, pp. 6189-6200 (2007).

Koeck, F.A.M. et al., "Substrate-diamond interface considerations for enhanced thermionic electron emission from nitrogen doped diamond films", J. Appl. Phys. 112, 113707 (2012).

Koeck, F.A.M. et al, "Low temperature onset for thermionic emitters based on nitrogen incorporated UNCD films", Diamond and Related Materials 12, pp. 232-234 (2009).

Koeck, F.A.M. et a;., "Thermionic electron emission from low work-function phosphorus doped diamond films", Diamond & Related Materials 18, pp. 789-791 (2009).

Koeck, F.A.M. et al., "Enhanced thermionic energy conversion and thermionic emission from doped diamond films through methane exposure", Diamond and Related Materials 20, pp. 1229-1233 (2011).

Koeck, F.A.M. et al., "Doped diamond thin film electron sources for thermionic energy conversion", 2013 26th International Vacuum Nanoelectronics Conference, Roanoke, VA, pp. 1-3 (2013).

Koizumi, S. et al., "Phosphorus-doped chemical vapor deposition of diamond", Diamond and Related Materials, 9, pp. 935-940 (2009).

Maida, O. et al., "Substrate temperature optimization for heavily-phosphorus-doped diamond films grown on vicinal (001) surfaces using high-power-density microwave-plasma chemical-vapor-deposition", Journal of Crystal Growth 424, pp. 33-37 (2015).

Luong, J.H.T. et al., "Boron-doped diamond electrode: synthesis, characterization, functionalization and analytical applications", Analyst, 134, pp. 1965-1979 (2009).

Nemanich, R.J. et al., "CVD Diamond—Research, applications and challenges", MRS Bulletin, vol. 39, pp. 490-494 (2014).

Ohtani, R. et al., "Large improvement of phosphorus incorporation efficiency in n-type chemical vapor deposition of diamond", Applied Physics Letters 105, 232106 (2014).

Pinault-Thaury, M.-A., et al., "n-Type CVD diamond: Epitaxy and doping", Materials Science and Engineering B 176, pp. 1401-1408 (2011).

Pinault-Thaury, M.-A., et al., "Phosphorus donor incorporation in (1 0 0) homoepitaxial diamond: Role of the lateral growth", Journal of Crystal Growth 335, pp. 31-36 (2011).

Schauer, S.N. et al., "Phosphorus incorporation in plasma deposited diamond films", Applied Physics Letters 64, 1094 (1994).

Schwede, J.W. et al., "Photon-enhanced thermionic emission from heterostructures with low interface recombination", Nature Communications 4:1576 (2013).

Schwede, J.W. et al., "Photon-enhanced thermionic emission for solar concentrator systems", Nature Materials 9, pp. 762-769 (2010).

Segev, G. et al., "High performance isothermal photo-thermionic solar converters", Solar Energy Materials & Solar Cells 113, pp. 114-123 (2013).

Smith, J.R. et al., "Thermionic Energy Conversion and Particle Detection Using Diamond and Diamond-Like Carbon Surfaces", PhD Thesis, North Carolina State University, Raleigh, North Carolina (2007).

Stenger, I. et al., "Impurity-to-band activation energy in phosphorus doped diamond", Journal of Applied Physics 114, 073711 (2013).

Sun, T. et al. "Combined visible light photo-emission and low temperature thermionic emission from nitrogen doped diamond films", Applied Physics Letters 99, 202101 (2011).

Sun. T. et al., "Thermally enhanced photoinduced electron emission from nitrogen-doped diamond films on silicon substrates", Physical Review B 90, 121302(R) (2014).

Sun, T., "Combined Photo- and Thermionic Electron Emission from Low Work Function Diamond Films", Phd Thesis, Arizona State University, Tempe, Arizona (2013).

(56) References Cited

OTHER PUBLICATIONS

Sun, T. et al., "Thermionic and photon-enhanced emission from CVD diamond and new approaches for energy conversion", International Workshop on Photon-Enhanced Thermionic Emission, Tel Aviv, Israel (2014).
Office Action issued in corresponding U.S. Appl. No. 15/151,295, dated Jul. 22, 2016, 25 pages.
Office Action issued in corresponding U.S. Appl. No. 15/151,295, dated Nov. 14, 2016, 30 pages.
Office Action issued in corresponding U.S. Appl. No. 15/151,295, dated Mar. 29, 2017, 25 pages.

* cited by examiner

D Radius of curvature for edge boundary
I Radius of curvature for inner pocket

SAMPLE STAGE/HOLDER FOR IMPROVED THERMAL AND GAS FLOW CONTROL AT ELEVATED GROWTH TEMPERATURES

CROSS-REFERENCES TO RELATED APPLICATIONS

This application is based on, claims the benefit of, and incorporates herein by reference in its entirety, U.S. Provisional Application Ser. No. 62/334,281, filed May 10, 2016, and entitled, "Sample Stage/Holder for Improved Thermal and Gas Flow Control at Elevated Growth Temperatures."

STATEMENT REGARDING FEDERALLY SPONSORED RESEARCH

This disclosure was made with government support under DE-AR0000453 awarded by the Advanced Research Projects Agency—Energy (ARAPA-E). The government has certain rights in the disclosure.

BACKGROUND

Diamond electronics can provide significant advances in high power and high frequency electronics, radiation detectors for medical and military applications, and UV optoelectronics due to exceptional material properties like large bandgap energy (5.5 eV), the breakdown electric field (10 MV/cm), the carrier mobilities (~2200 and ~1600 cm2/Vs for electrons and holes resp.), the thermal conductivity (10-20 W/cmK), the low dielectric constant (5.5), and the excellent resistance to radiation. Requisite for diamond electronics is the preparation of n-type and p-type material, the building blocks for discrete semiconductors.

While p-type diamond can be readily obtained through boron doping, n-type doping is still challenging especially for (100) oriented diamond surfaces. Various approaches for increased doping efficiency have focused on off-axis surfaces where the (100) surface is polished at an angle to establish a boundary that has been shown to promote the incorporation of phosphorus impurities. However, these approaches have suffered from repeatability and reliability issues, and most electronically suitable n-type diamond devices are still prepared from (111) wafers which limits the device properties and has a disadvantage in cost and maximum wafer size.

Thus, there is a need for new methods and devices for increasing doping efficiency in diamond surfaces.

SUMMARY

According to a first aspect, an apparatus is provided for manufacturing diamond electronic devices. The apparatus includes a base comprising a water-block and a cover that at least partially covers the water-block. The apparatus includes a sample stage disposed on the base. The apparatus further includes a sample holder disposed on the sample stage and configured to accept a diamond substrate.

According to a second aspect, an apparatus is provided for manufacturing diamond electronic devices. The apparatus includes a base including a fluid container and a cover that at least partially covers the fluid container. The apparatus includes a sample stage holder disposed on the base, the sample stage holder comprising a sample holder configured to accept a diamond substrate. The apparatus includes a thermal interface between the base and the sample stage holder.

According to a third aspect, a plasma enhanced chemical vapor deposition (PECVD) reactor is provided. The PECVD includes a chamber, a based disposed in the chamber, a sample stage holder disposed on the base, and a thermal interface. The chamber is surrounded at least partially by a reactor wall. The base includes a fluid container and a cover that at least partially covers the fluid container. The sample stage holder includes a sample holder configured to accept a diamond substrate. The thermal interface is disposed between the base and the sample stage holder.

It is to be understood that both the foregoing general description and the following detailed description are exemplary and explanatory only and are not restrictive.

DETAILED DESCRIPTION OF THE DISCLOSURE

Before the present disclosure is described in further detail, it is to be understood that the disclosure is not limited to the particular embodiments described. It is also to be understood that the terminology used herein is for the purpose of describing particular embodiments only, and is not intended to be limiting. The scope of the present disclosure will be limited only by the claims.

As used herein, the singular forms "a", "an", and "the" include plural embodiments unless the context clearly dictates otherwise.

Specific structures, devices, and methods relating to manufacturing of diamond electronic devices have been disclosed. It should be apparent to those skilled in the art that many additional modifications beside those already described are possible without departing from the inventive concepts. In interpreting this disclosure, all terms should be interpreted in the broadest possible manner consistent with the context. Variations of the term "comprising" should be interpreted as referring to elements, components, or steps in a non-exclusive manner, so the referenced elements, components, or steps may be combined with other elements, components, or steps that are not expressly referenced. Embodiments referenced as "comprising" certain elements are also contemplated as "consisting essentially of" and "consisting of" those elements. If a series of numerical ranges are recited, this disclosure contemplates combinations of the lower and upper bounds of those ranges that are not explicitly recited. For example, if a range between 1 and 10 or between 2 and 9 is recited, this disclosure also contemplates a range between 1 and 9 or between 2 and 10.

For example, manufacturing of diamond electronic devices based on (100) oriented substrates may be preferred due to its electronic properties and more economical fabrication. Obtaining n-type and p-type electronic character through impurity doping is necessary for diamond electronics and optoelectronics. Implantation doping of diamond has shown limited success and incorporation of dopant impurities (B, P, N) during epitaxial layer growth is the primary approach for fabrication of diamond electronic device structures. For diamond, the preparation of n-type semiconducting (100) material still presents a challenge, while (111) oriented surfaces readily accept phosphorus as donor states in the lattice. The disclosure provides a method and apparatus for significant phosphorus incorporation in epitaxial diamond layers grown on (100) oriented substrates through the use of a pulsed deposition technique.

Figure 1:
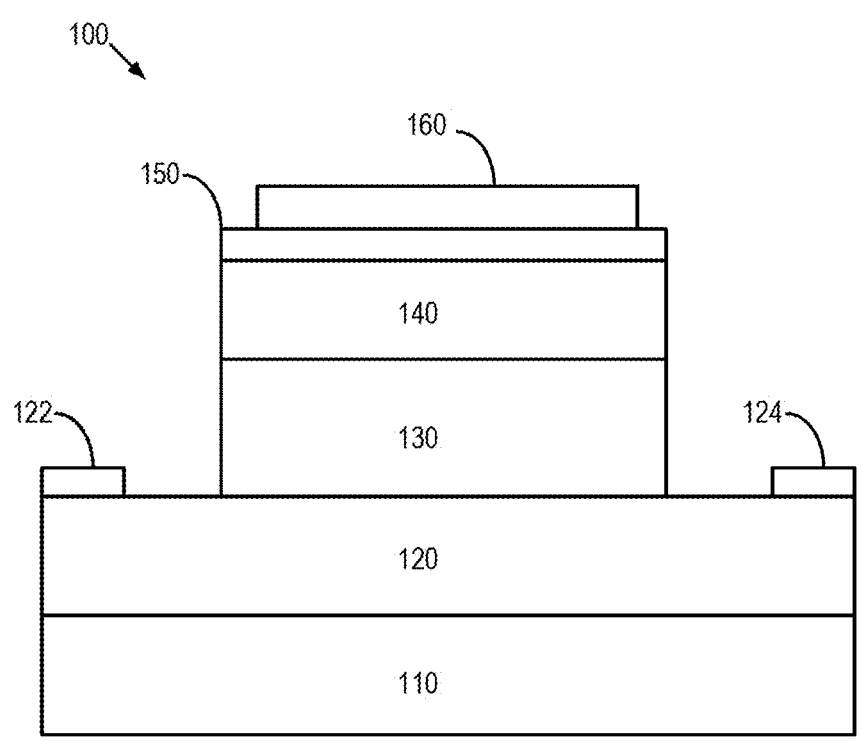
FIG. 1 illustrates a homoepitaxial n-i-p diode structure according to the disclosure.

FIG. 1 illustrates a homoepitaxial quasi-vertical n-i-p diode structure according to the disclosure. The homoepitaxial quasi-vertical n-i-p diode structure 100 includes a substrate 110, which may be a substrate with an optical grade having an optical transmission greater than 70%. For example, the substrate may be a type IIa plate with a dimension of 3 mm by 3 mm or larger with thickness greater or equal to 0.2 mm. For true vertical devices the substrate may be a boron doped type IIb plate. The layer 120 may be a film doped with boron for p-type material and the layer 140 may be a film doped with phosphorus for n-type material. The layer 130 between layers 120 and 140 may be an intrinsic or lightly doped interface layer. The n-i-p diode structure 100 may further include n+ layer 150 deposited on the layer 140. For example, the layer 120 may be a p-type layer doped with Boron. The layer 120 may have a thickness of about 9.95 um or optimized to desired device properties, e.g. breakdown voltage.

The n-i-p diode structure 100 may further include contact layers 122 and 124 deposited on the layer 120. The contact layers 122 and 124 may include Ti/Pt/Au with respective thicknesses of about 50 nm/50 nm/150 nm. The n-i-p diode structure 100 may further include a contact layer 160 deposited on the n+ layer 150. The contact layer 160 may include Ti/Pt/Au/Ni with respective thicknesses of about 50 nm/50 nm/150 nm/50 nm. Other electrical contacts may include nano-structured and doped diamond.

To grow a phosphorus doped diamond layer on the substrate, a CVD reactor may be used to heat the substrate using plasma. The CVD reactor may include a phosphorus source including 200 ppm trimethylphosphine/hydrogen gas mixture. The CVD reactor may include a fluid-cooled sample stage that exploits plasma focusing. The CVD reactor may use a pyrometer exploiting reflectivity change to monitor temperature and film thickness.

Figure 2A:
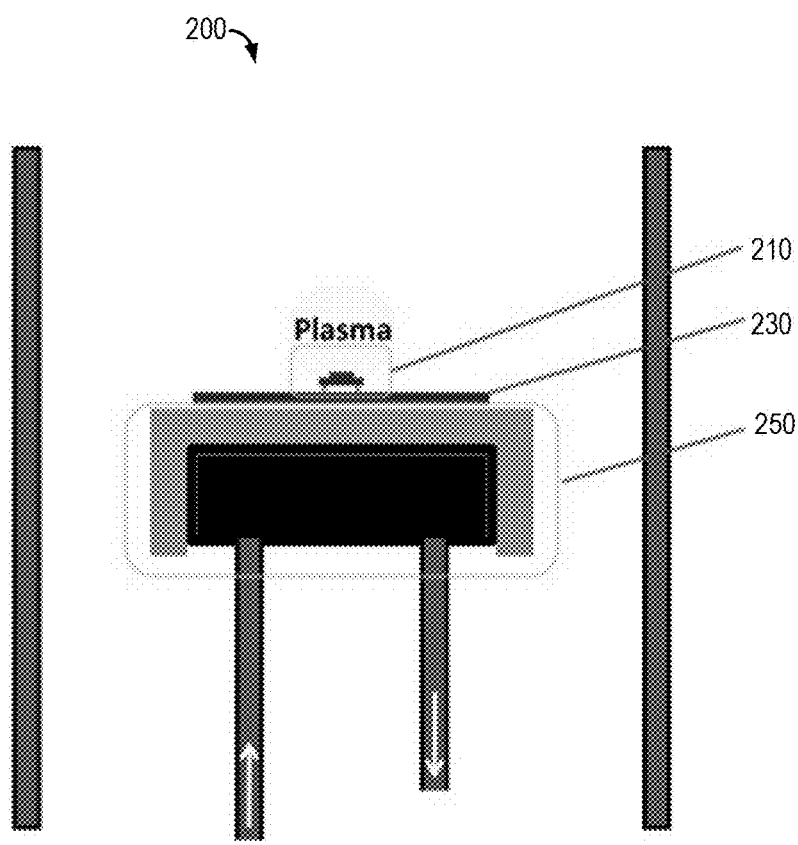
FIG. 2A illustrates an apparatus according to the disclosure.

FIG. 2A illustrates an apparatus according to the disclosure. The apparatus may include a sample support 200 that includes a sample holder 210, a sample stage 230, and a base 250. The sample stage 230 is disposed on the base 250. The sample holder 210 is disposed on the sample stage 230 and is configured to accept a diamond substrate.

Figure 2B:
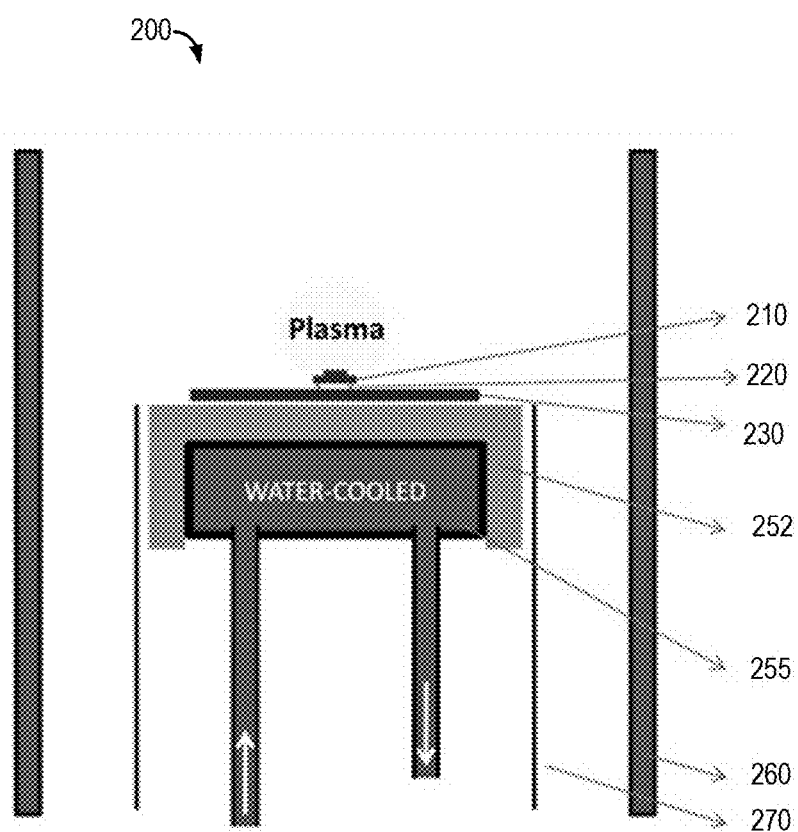
FIG. 2B illustrates the apparatus of FIG. 2A.

As shown in FIGS. 2A-B, the base 250 may include a fluid container 255, which may be a water-block. The base 250 may further include a cover 252 that at least partially covers the fluid container 250. The cover 252 may include: molybdenum, tantalum, or a combination of both molybdenum and tantalum or other vacuum and plasma compatible materials. For example, the cover 252 may include at least one of the following: molybdenum, tantalum, tungsten, molybdenum carbides, tantalum carbides, and tungsten carbides with an optional diamond coating. As shown in FIG. 2B, the apparatus 200 may include a thermal separation 220 between the sample holder 210 and the sample stage 230. The apparatus 200 may also include water-cooled reactor wall 260 and choke 270.

Figure 2C:
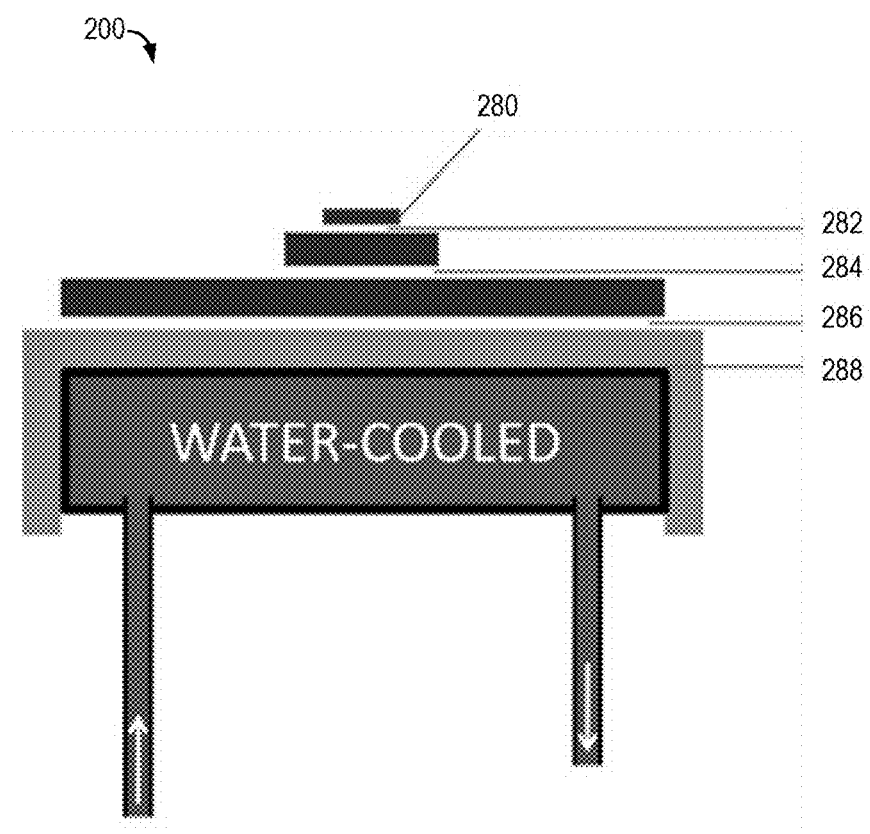
FIG. 2C illustrates the apparatus of FIG. 2A.

FIG. 2C illustrates that the apparatus 200 may include multiple thermal interfaces between different structure layers. As shown in FIGS. 2A-C, the first thermal interface 282 is between the diamond substrate 280 and the sample holder 210. The second thermal interface 284 is between the sample holder 210 and the sample stage 230. The second thermal interface 284 may correspond to the thermal separation 220 in FIG. 2B. The third thermal interface 286 is between the sample stage 230 and the cover 252. The fourth thermal interface 288 is between the cover 252 and the fluid container 255.

The thermal interfaces may be controlled by separation of the corresponding components by a specified amount e.g. utilizing suitable spacer elements. For highest heat transfer the separation is eliminated through direct contact between the components. For example, thermal interfaces 282, 286 and 288 may be established through direct contact of the corresponding components while thermal interface 284 may be separated using 0.25 mm diameter tantalum wire spacers. Thus, the apparatus includes controlled thermal interfaces between water-block, sample stage, sample holder and diamond substrate.

Here, thermal separation may be established through suitable spacers that can also be incorporated in the stage or sample holder element. Alternatively, the sample stage and holder may be manufactured into a single element. Each configuration presents a thermal assembly that may be tuned to requirements in the diamond growth process. In high microwave power applications, individual support elements may be merged and machined into a single unit to maintain temperature controlled support components.

Figure 3A:
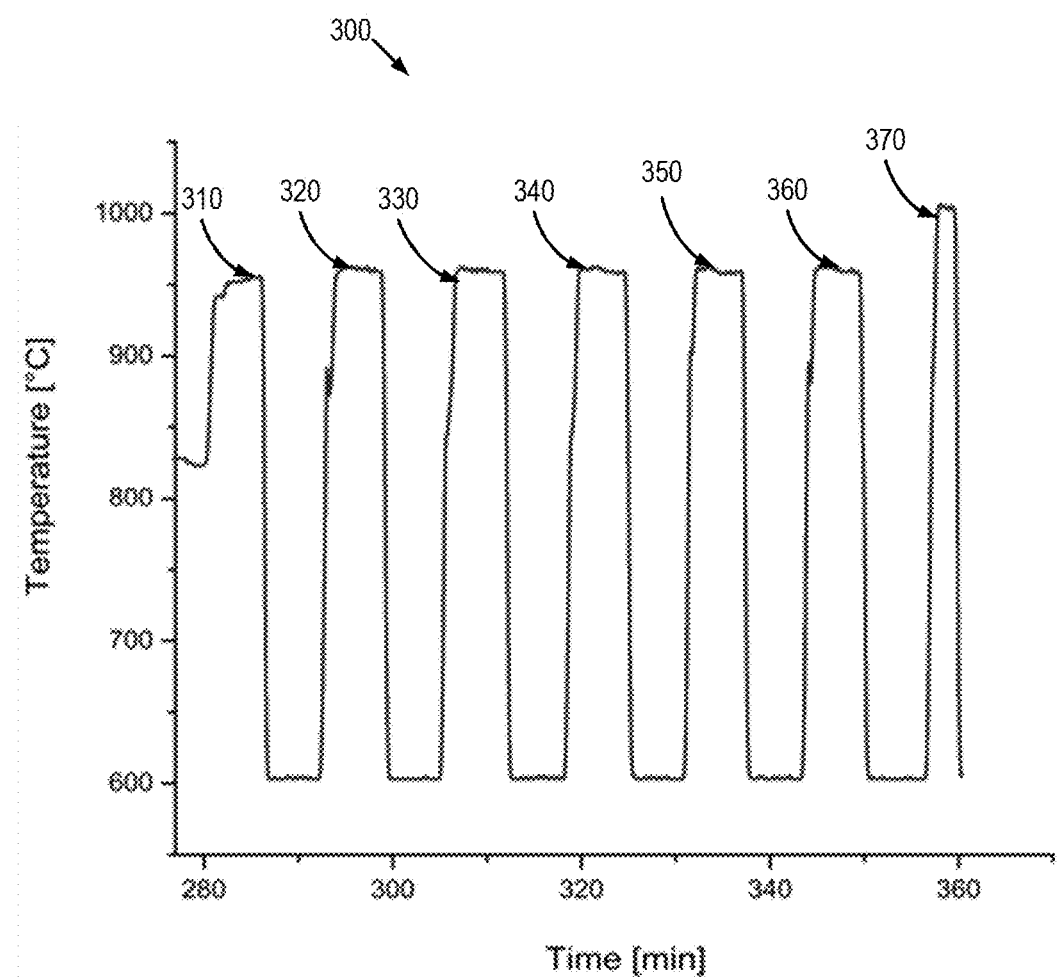
FIG. 3A illustrates temperature changes over time according to the disclosure.

FIG. 3A illustrates temperature changes over time according to the disclosure. The process 300 may include at least six repetitions 310, 320, 330, 340, 350, and 360. Each repetition may include a growth cycle and a cooling cycle. The growth cycle may have a longer time period than the cooling cycle.

For example, the temperature of the substrate may be controlled and recorded by a dual-color pyrometer that is capable of measuring temperatures >600° C. In FIG. 3A, the temperature profile is shown for a pulsed deposition run where growth and cooling have equal 5 minute periods repeated for 6 cycles. The final growth step 370 is adjusted to a temperature exceeding 1000° C. for about 2 minutes. It should be noted that the recorded curve is averaged during data acquisition. Further, the minimum temperature of 600° C. during cooling cycles represents the lower minimum of the pyrometer with the actual temperature less than 250° C.

Figure 3B:
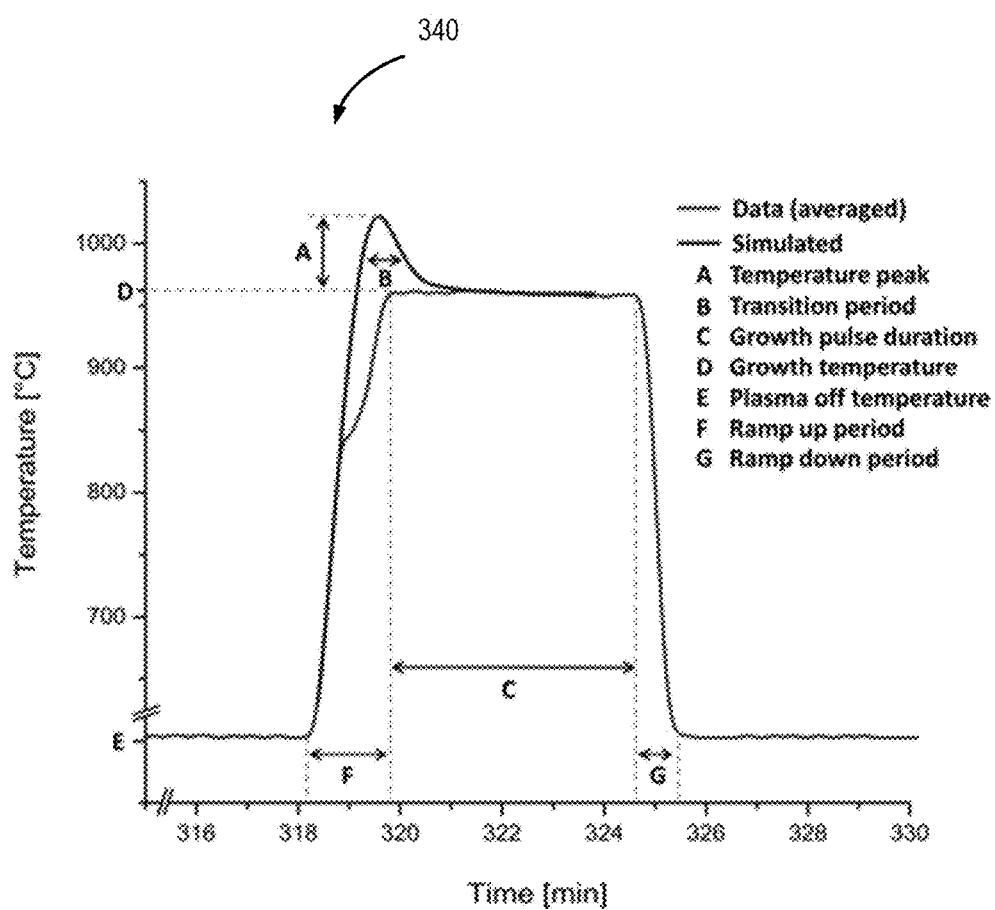
FIG. 3B illustrates averaged and simulated temperature changes over time according to the disclosure.

FIG. 3B illustrates averaged and simulated temperature changes over time according to the disclosure. A detailed display of the growth pulse shown in FIG. 3B presents individual components that may be adjusted to achieve a continuous doping profile. Here, the ramp up (F) and ramp down (G) period may be determined by the configuration of the sample stage and CVD reactor. The temperature peak (A) may be adjusted through increased methane flow and also through adjustment of the microwave power/chamber pressure.

Figure 4:
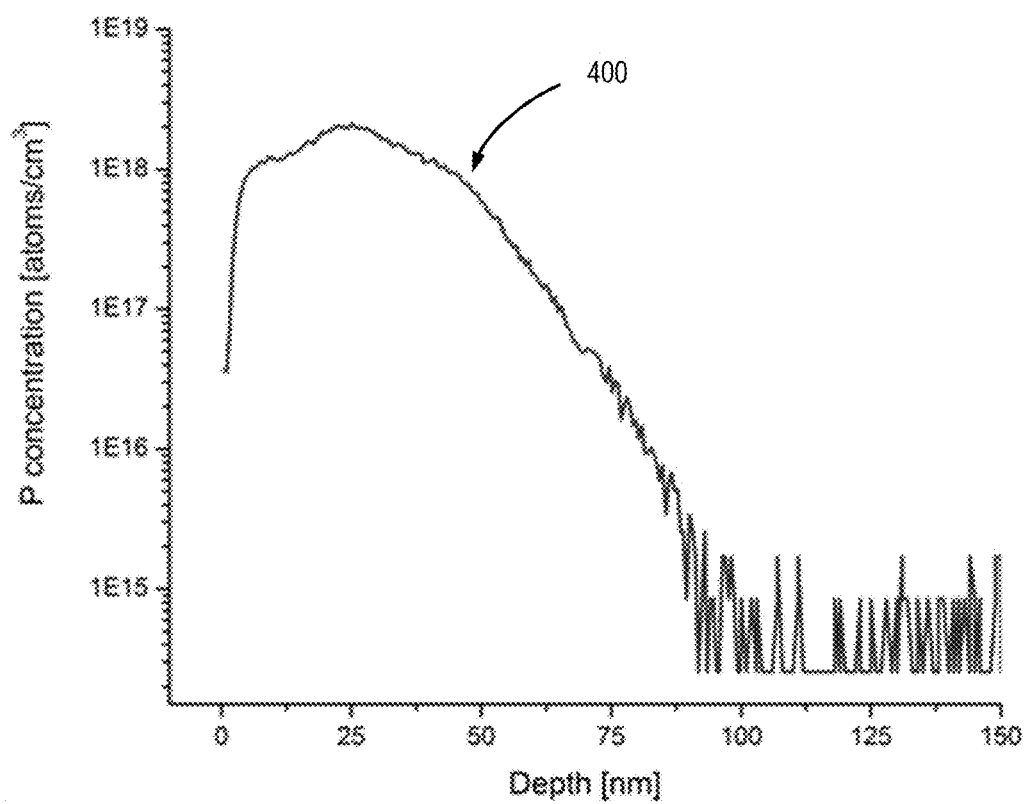
FIG. 4 illustrates P concentration over depth according to the disclosure.

FIG. 4 illustrates P concentration over depth according to the disclosure. The SIMS profile 400 illustrates a phosphorus doped diamond film prepared by the pulsed growth technique. For example, the phosphorus incorporation for a doped diamond layer using the pulsed deposition mode may be evaluated by SIMS as shown in FIG. 4. The results indicate a significant doping concentration exceeding 1E18 cm-3. Increasing the phosphorus concentration during the growth pulse may achieve a higher dopant incorporation.

The table below shows some of the growth parameters for i-n structure

TABLE 1

| Parameter | Step 1 | Step 2 | (Step 3) ×7 | Step 4 |
|---|---|---|---|---|
| Hydrogen [sccm] | 400 | 398 | 388 | 388 |
| Methane [sccm] | 0 | 2 | 2 | 2 |
| TMP/Hydrogen | 0 | 0 | 10 | 10 |
| μ-wave [W] | 2000 | 2000 | 2500 | 2500 |
| Pressure [torr] | 80 | 65 | 80 | 85 |
| Pyrometer [° C.] | 905 | 804 | 965 | ~1000 |
| Time [min] | 15 | 360 | 5 | 5 |

For example, diamond deposition may be achieved through plasma enhanced chemical vapor deposition (PECVD) utilizing hydrogen (H2) as a carrier gas, methane (CH4) as a carbon source and a phosphorus source, here a 200 ppm trimethylphosphine/hydrogen (TMP/H2) gas mixture. In the pulsed deposition mode, hydrogen flow suitable for diamond growth is established, a plasma is ignited and chamber pressure and microwave power adjusted for diamond growth. With the diamond substrate at an elevated temperature, methane and the phosphorus source may be introduced at gas flow rates for diamond growth (less than 5% of the total gas flow for methane). As the carbon and phosphorus sources are introduced into the growth chamber, the doped deposition commences when the plasma is excited with microwave radiation which creates the reactive species for deposition and transfers energy to the substrate that results in a temperature rise. The duration of the growth pulse is accurately timed, and it is terminated by plasma shut-down.

A timed cooling period separates the deposition pulses where gas flow may optionally be established at similar flow rates. The repetitive growth pulses achieve significant phosphorus incorporation where the higher temperature growth pulses may increase the concentration of phosphorus incorporation to achieve n-type electrical properties. Variation of the gas flow rates, pressure, and plasma power may enable tuning the doping concentration and n-type doping characteristics.

Diamond may be synthesized by various techniques; high pressure—high temperature application, hot filament and plasma enhanced chemical vapor deposition (PECVD) where plasma enhanced growth processes are preferred in industrial operations that focus on high purity material with low defect densities. Diamond growth utilizing PECVD employs a gas mixture of hydrogen and methane where the methane flow rate may be up to several percent of the total gas flow rate. Dopants are similarly introduced, most commonly, through a gaseous source that may be diluted in hydrogen.

The disclosure provides an apparatus for deposition, the CVD reactor, which may be water-cooled to control the system temperature during growth. As the reactor walls are actively cooled adsorption of species like dopants can affect growth and doping processes. The reactor may include a water-cooled sample stage that holds the substrate. The experimental set-up is designed to allow heating of the substrate by plasma energy while maintaining all other reactor components at significantly lower temperatures.

With the substrate positioned in the plasma, its energy will result in heating, which may be further enhanced through a plasma focusing geometry enabled by the design of the substrate holder. This design eliminates the need of an additional substrate heater, which is often a source of impurities that reduce doping effectiveness. In this disclosure, a specially designed substrate holder that accepts single crystal diamond plates is mounted on a water-cooled sample stage. This configuration allows thermal controls where the diamond substrate may exhibit the greatest temperature increase because it is closest to the plasma and it can be thermally separated from actively cooled components. The materials of the sample holder exposed to the plasma are molybdenum, tantalum or similar and may be coated by diamond to reduce incorporation of impurities during plasma discharge.

The design of the thermal configuration provides a means to control the substrate temperature taking into account the microwave power, chamber pressure and gas flow rates. The stacked configuration of the sample stage/holder establishes thermal interfaces in FIG. 2C, which may be adjusted to achieve a temperature profile suitable for diamond growth. This protruding sample holder configuration allows control of the plasma geometry and a focusing of the plasma discharge occurs centered around the diamond substrate. With the accompanying increase in plasma density adjacent to the substrate, its temperature can be efficiently increased. As the surrounding components are actively cooled during growth, impurity incorporation is minimized and doping may be achieved through evolvement of adsorbed dopant species during film growth.

Figure 5A:
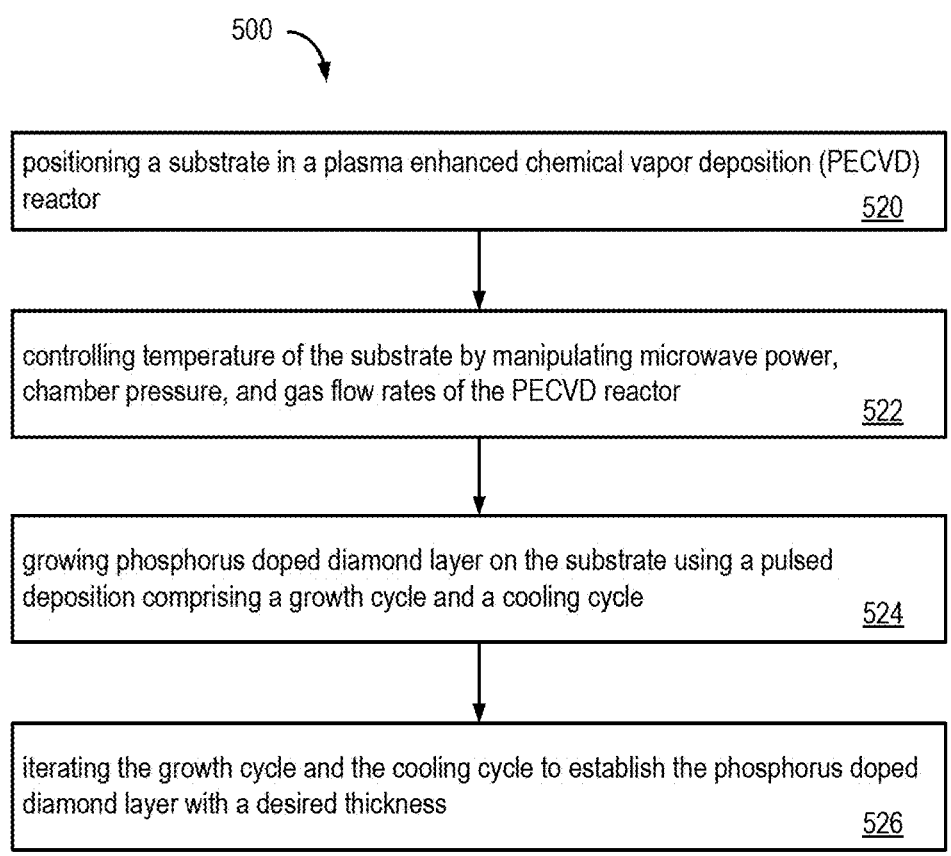
FIG. 5A illustrates a method according to a first aspect of the disclosure.

FIG. 5A illustrates a method according to a first aspect of the disclosure. The method 500 includes at least one of the following acts and additional acts may be added if needed. The method 500 may be implemented using a reactor such as a PECVD reactor. In act 520, a substrate is positioned in the PECVD reactor. The PECVD reactor may include robotic arms or other automatic component to position the substrate. The PECVD may include a base and a sample stage holder disposed on the base, where the sample stage holder comprises a sample holder.

In act 522, the PECVD reactor may use a controller to control temperature of the substrate by manipulating microwave power, chamber pressure, and gas flow rates of the PECVD reactor. The controller may be implemented using a hardware processor, a software program, or a combination of hardware and software.

In act 524, the PECVD reactor grows phosphorus doped diamond layer on the substrate using a pulsed deposition including a growth cycle and a cooling cycle. The growth cycle and cooling cycle may have an equal time duration as shown in FIG. 3A. Alternatively, the growth cycle and cooling cycle may have different durations.

In act 526, the PECVD reactor may iterate the growth cycle and the cooling cycle to establish the phosphorus doped diamond layer with a desired thickness. For example, the PECVD reactor may iterate at least four repetitions of growth and cooling cycles. The number of iterations may be adjusted by a controller.

Figure 5B:
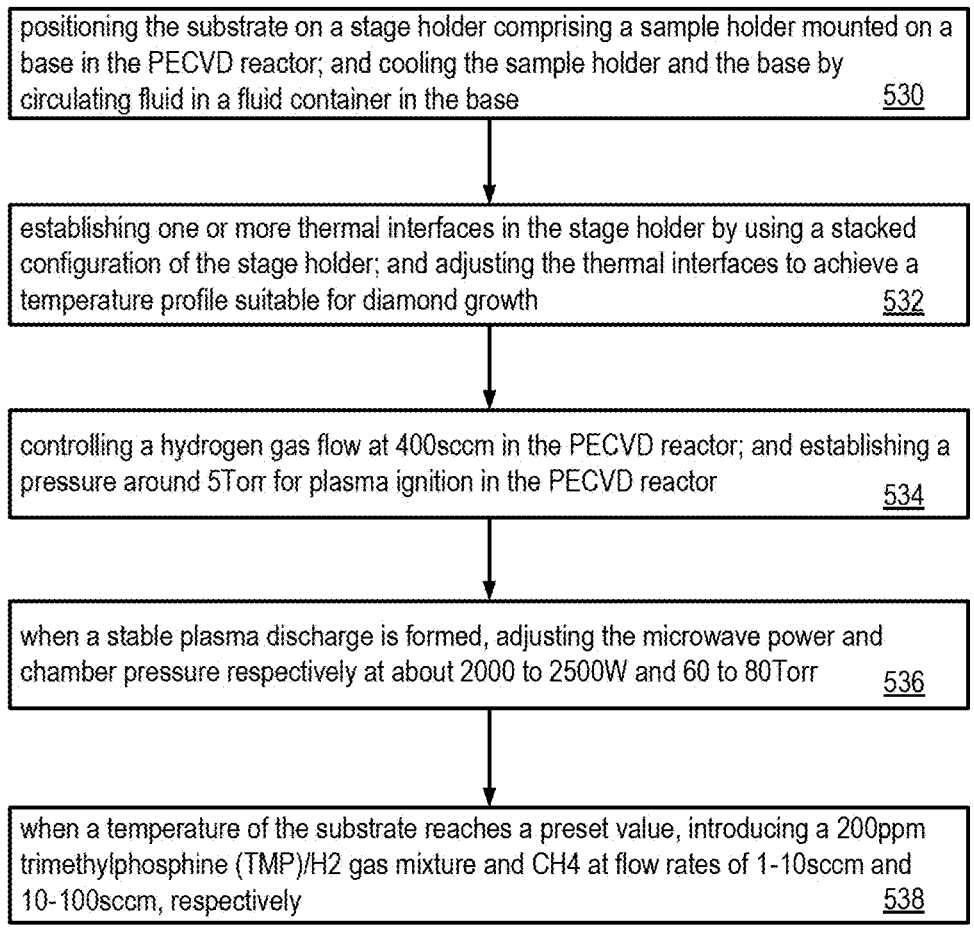
FIG. 5B illustrates additional acts in the method of FIG. 5A according to the disclosure.

FIG. 5B illustrates additional acts in the method of FIG. 5A according to the disclosure. In act 530, the PECVD reactor may position the substrate on a stage holder including a sample holder mounted on a base in the PECVD reactor. The PECVD reactor may cool the sample holder and the base by circulating fluid in a fluid container in the base. For example, the PECVD reactor may include a water container and use water circulation to cool the sample holder and the base.

In act 532, the PECVD reactor may establish one or more thermal interfaces in the stage holder by using a stacked configuration of the stage holder. The PECVD reactor may adjust the thermal interfaces to achieve a temperature profile suitable for diamond growth. For example, thermal insulation material may be added to one or more of the thermal interfaces when needed.

In act 534, the PECVD reactor may control a hydrogen gas flow at 400 sccm in the PECVD reactor to initiate the diamond growth process. The PECVD reactor may establish a pressure around 5 Torr for plasma ignition in the PECVD reactor at the same time.

In act 536, when a stable plasma discharge is formed, the PECVD reactor may adjust the microwave power and chamber pressure respectively at about 2000 to 2500 W and 60 to 80 Torr. Depending on the desired growth rate and final dopant concentration in the substrate, the PECVD reactor may adjust the microwave power and chamber pressure accordingly.

In act 538, when a temperature of the substrate reaches a preset value, the PECVD reactor may introduce a 200 ppm trimethylphosphine (TMP)/H2 gas mixture and CH4 at flow rates of 1-10 sccm and 10-100 sccm, respectively.

Figure 5C:
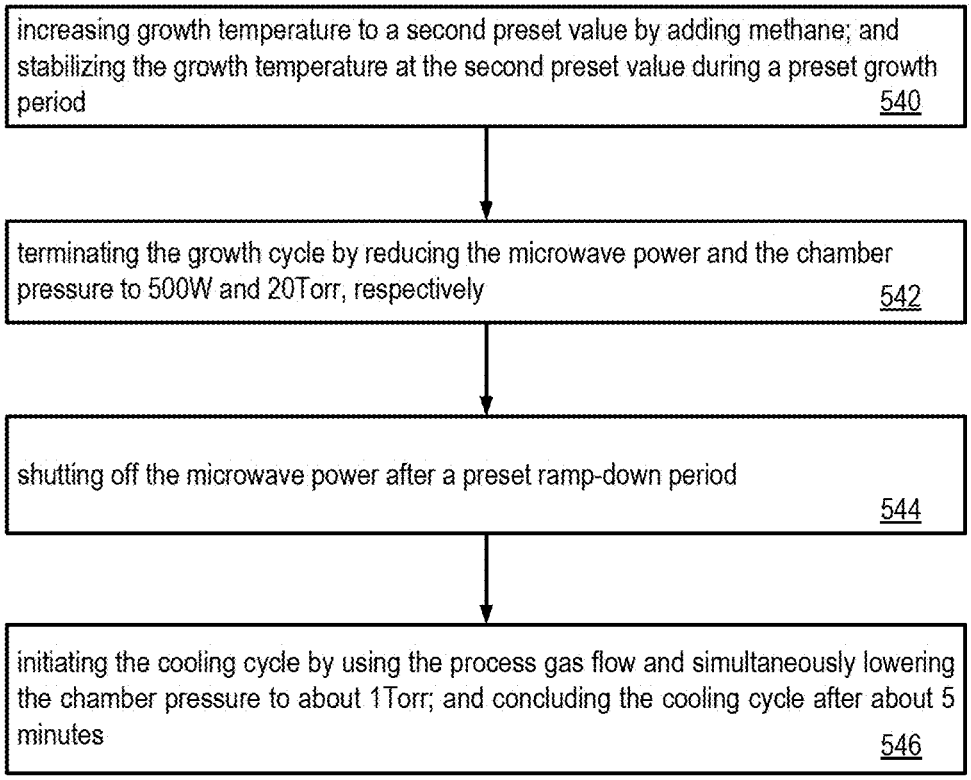
FIG. 5C illustrates additional acts in the method of FIG. 5A according to the disclosure.

FIG. 5C illustrates additional acts in the method of FIG. 5A according to the disclosure. In act 540, the PECVD reactor may increase growth temperature to a second preset value by adding methane. The PECVD reactor may stabilize the growth temperature at the second preset value during a preset growth period. The growth temperature may range between 900° C. and 1200° C. and the growth period may be about 5 minutes. The growth period may be longer or shorter to meet the desired growth rate.

In act 542, the PECVD reactor may terminate the growth cycle by reducing the microwave power and the chamber pressure to about 500 W and 20 Torr, respectively. In act 544, the PECVD reactor may shut off the microwave power after a preset ramp-down period. In act 546, the PECVD reactor may initiate the cooling cycle by using the process gas flow and simultaneously lowering the chamber pressure to about 1 Torr. The PECVD reactor may conclude the cooling cycle after about 5 minutes.

Figure 6A:
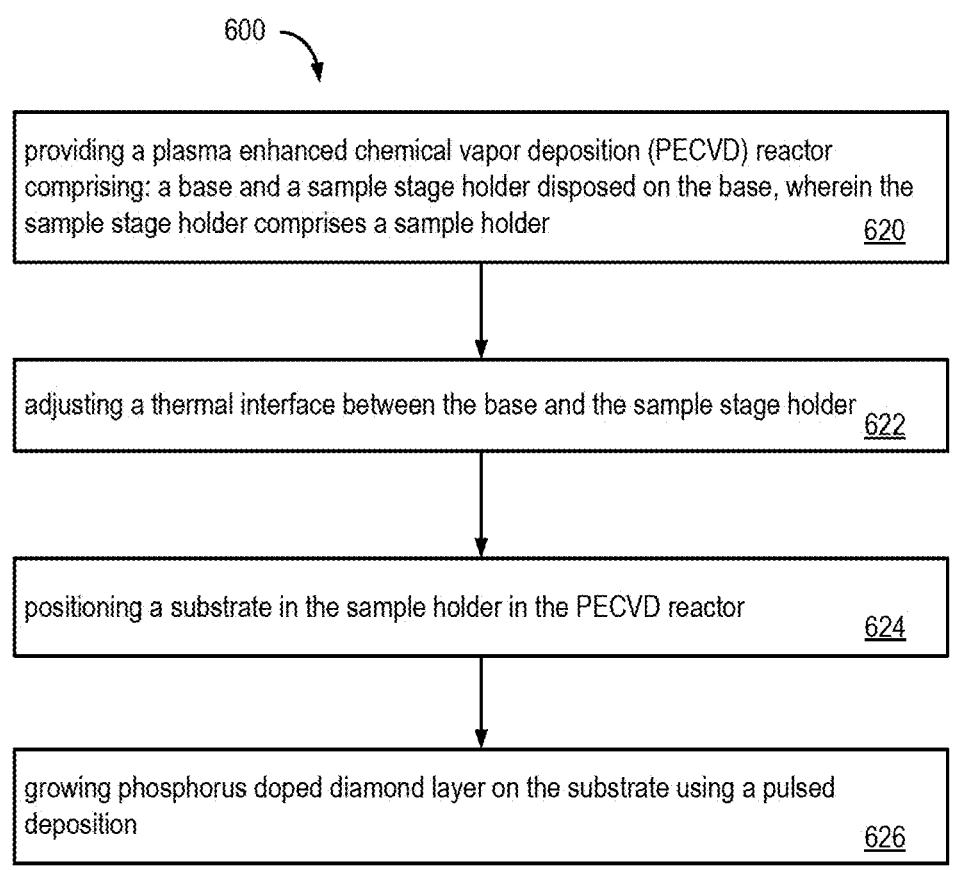
FIG. 6A illustrates an example method according to a second aspect of the disclosure.

FIG. 6A illustrates an example method according to a second aspect of the disclosure. The method 600 includes at least one of the following acts. In act 620, a PECVD reactor is provided. The PECVD reactor includes: a base and a sample stage where the stage is disposed on the base and a holder disposed on the base.

In act 622, the thermal interface between the base and the sample stage holder may be adjusted. The thickness of the thermal interface may be adjusted by controlling the distance between different components of the base, stage and sample holder.

In act 624, a substrate is positioned in the sample holder in the PECVD reactor. The PECVD reactor may include a robotic arm or other mechanic components to position the substrate in the sample holder.

In act 626, a phosphorus doped diamond layer is grown on the substrate using a pulsed deposition. The PECVD reactor may use a controller to control growth parameters in the chamber during the pulsed deposition.

Figure 6B:
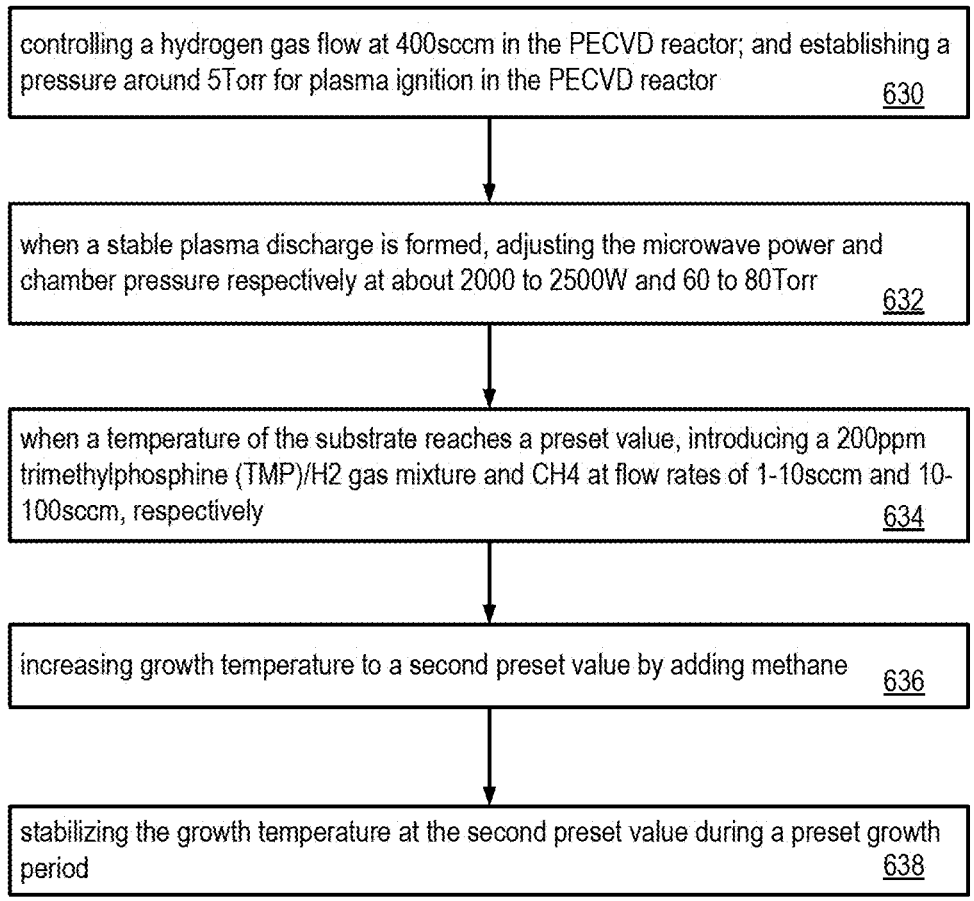
FIG. 6B illustrates additional acts in the method of FIG. 6A according to the disclosure.

FIG. 6B illustrates additional acts in the method of FIG. 6A according to the disclosure. In act 630, the PECVD reactor may control a hydrogen gas flow at 400 sccm in the PECVD reactor; and establishes a pressure around 5 Torr for plasma ignition in the PECVD reactor. In act 632, when a stable plasma discharge is formed, the PECVD reactor may adjust the microwave power and chamber pressure respectively at about 2000 to 2500 W and 60 to 80 Torr. In act 634, when a temperature of the substrate reaches a preset value, the PECVD reactor may introduce a 200 ppm trimethylphosphine (TMP)/H2 gas mixture and CH4 at flow rates of 1-10 sccm and 10-100 sccm, respectively. In act 636, the PECVD reactor may increase growth temperature to a second preset value by adding methane. In act 638, the PECVD reactor may stabilize the growth temperature at the second preset value during a preset growth period.

Figure 6C:
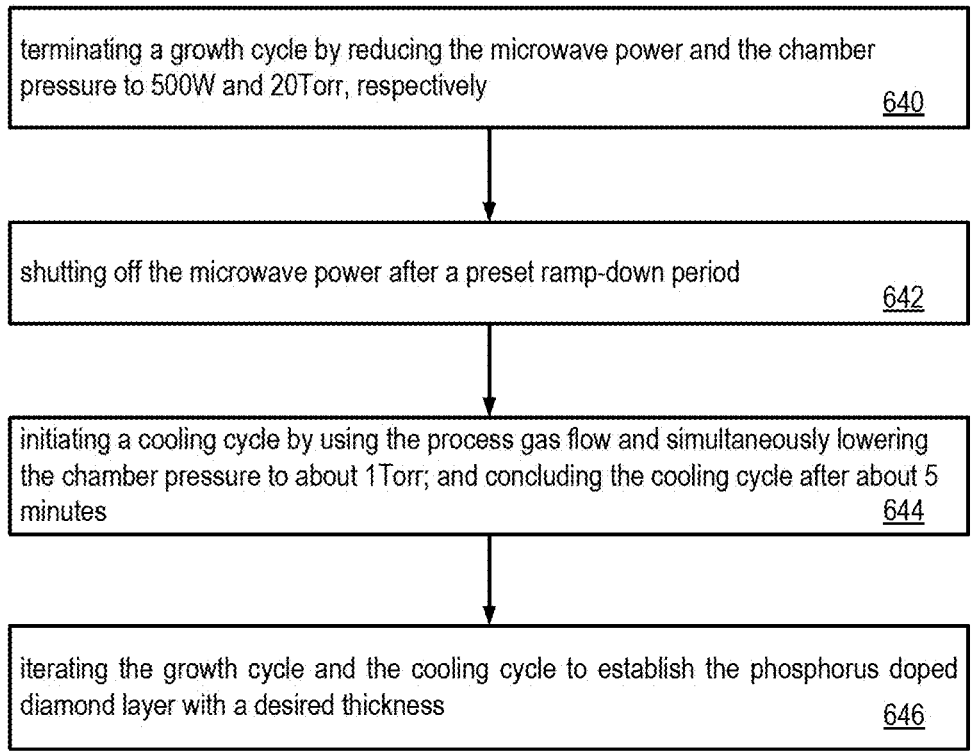
FIG. 6C illustrates additional acts in the method of FIG. 6A according to the disclosure.

FIG. 6C illustrates additional acts in the method of FIG. 6A according to the disclosure. In act 640, the PECVD reactor may terminate a growth cycle by reducing the microwave power and the chamber pressure to about 500 W and 20 Torr, respectively. In act 642, the PECVD reactor may shut off the microwave power after a preset ramp-down period. In act 644, the PECVD reactor may initiate a cooling cycle by using the process gas flow and simultaneously lowering the chamber pressure to about 1 Torr; and concluding the cooling cycle after about 5 minutes. In act 646, the PECVD reactor may iterate the growth cycle and the cooling cycle to establish the phosphorus doped diamond layer with a desired thickness.

Following is an example for the growth process. In a water-cooled reactor, the hydrogen gas flow is controlled at about 400 sccm and a pressure suitable for plasma ignition (around 5 Torr) is established. When a stable plasma discharge is formed, the microwave power and chamber pressure is adjusted for diamond growth, for example, at 2000 to 2500 W and 60 to 80 Torr, respectively.

As the temperature of the substrate in the hydrogen plasma reaches a pre-set value, around 800° C., the 200 ppm trimethylphosphine (TMP)/H2 gas mixture and CH4 is introduced at flow rates of 1-10 sccm and 10-100 sccm, respectively. With the addition of methane, a temperature increase is observed that may spike at a temperature >1000° C. and then stabilizes at the growth temperature established by pressure and microwave power. Utilizing plasma focusing in the sample holder configuration, the growth temperature may range between 900° C. and 1200° C. The growth period at this temperature may be timed for about 5 minutes. Termination of the growth cycle commences by reducing the microwave power and the chamber pressure to about 500 W and 20 Torr, respectively, in a ramp down process that is timed for about one minute after which the microwave power is shut off. This initiates the cooling cycle that is promoted by the process gas flow and simultaneously lowering of the chamber pressure to the minimum achievable by the process pump, here, 1 Torr. After about 5 minutes, this cooling cycle is concluded. The chamber pressure is then adjusted to about 5 Torr, methane and TMP/H2 flow shut down and a pure hydrogen plasma ignited which constitutes the beginning of a successive growth step.

Iterations of the growth and cooling cycle establish a phosphorus doped diamond layer with desired thickness. Higher doping concentrations may be achieved by increasing the supply of the dopant gas flow in the reactor, e.g. increased TMP/H2 flow rate, and increasing the microwave power/chamber pressure to obtain a higher substrate temperature.

Figure 7A:
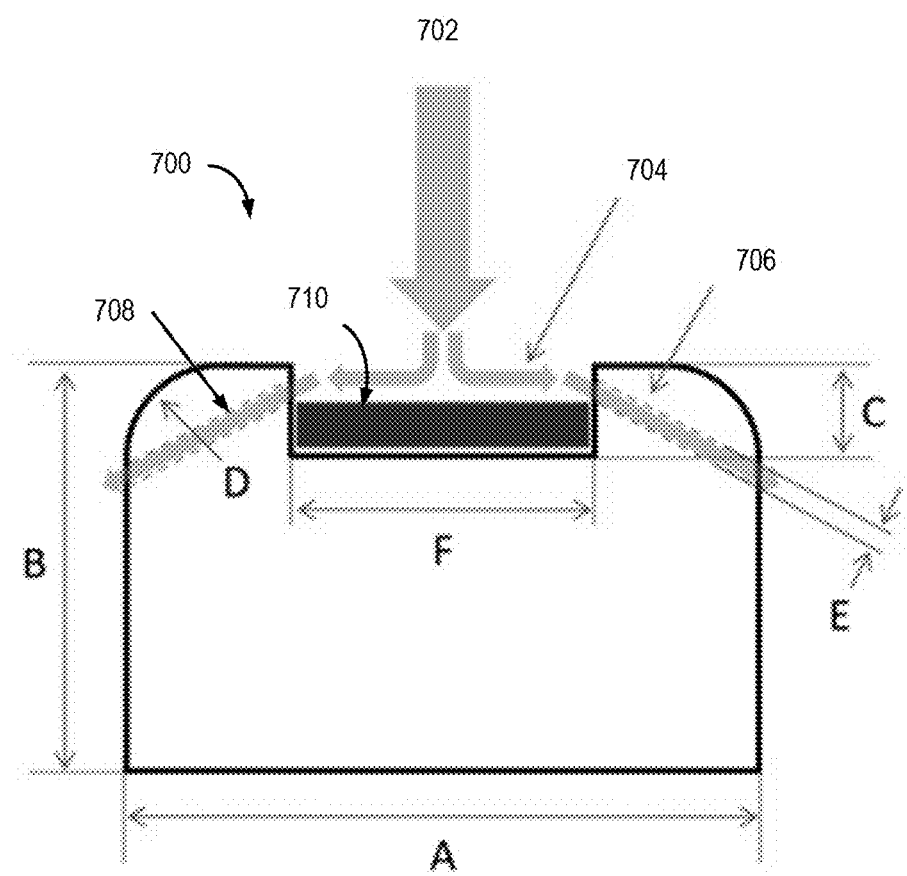
FIG. 7A illustrates an outline of a sample holder according to the disclosure.

FIG. 7A illustrates an outline of a sample holder according to the disclosure. The sample holder 700 includes a pocket 704 that accepts a diamond substrate 710. The sample holder 700 further includes flow channels 706 and 708 on different sides of the pocket 704. The sample holder 700 may have a diameter A of 10 mm and a height B of 3 mm. The pocket 704 has a pocket depth C of 1 mm. The radius of curvature for edge boundary is D of 1 mm. The flow channels 706 and 708 may have flow channel diameter of E of 0.25 mm and the pocket size of the pocket 704 is F of 3.5 mm.

Figure 7B:
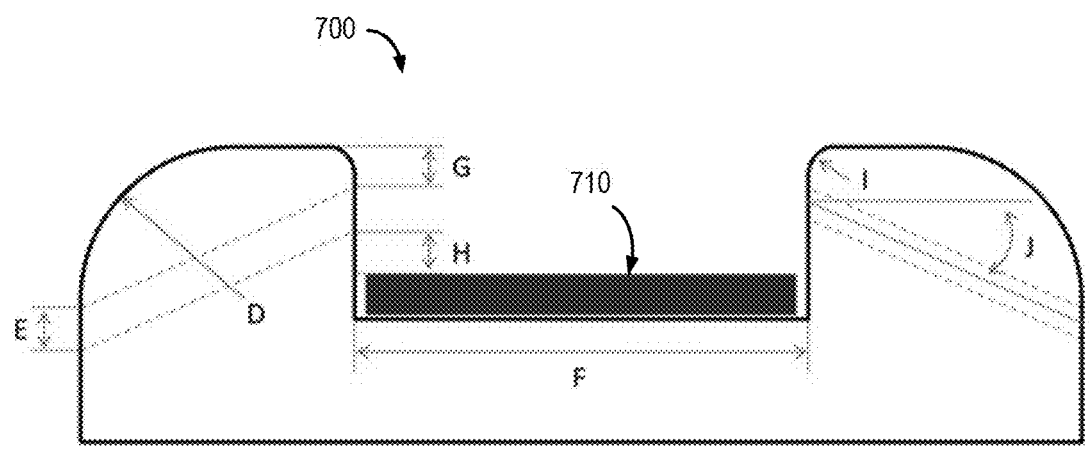
FIG. 7B illustrates a detailed view of the sample holder of FIG. 7A according to the disclosure.

FIG. 7B illustrates detailed view of the sample holder of FIG. 7A according to the disclosure. The distance between the flow channel top and the sample holder top is G, which is between 0.1 mm and 1 mm. The distance between the flow channel bottom and the diamond surface is H, which is between 0.1 mm and 1 mm. The radius of curvature for inner pocket is I, which is between 0.1 mm and 1 mm. The flow channel angle J is between 0.1° and 45°.

Figure 7C:
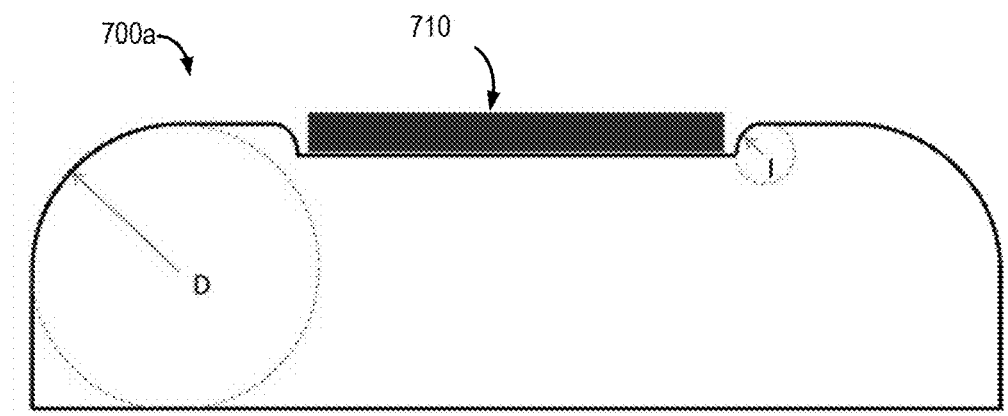
FIG. 7C illustrates a sample holder with elevated diamond substrate positioning according to the disclosure.

FIG. 7C illustrates a sample holder 700a with elevated diamond substrate positioning according to the disclosure. The sample holder 700a has a shallower pocket depth compared with the sample holder 700 shown in FIG. 7B. Here, the radius of curvature for edge boundary D is between 0.1 mm and 1 mm and the radius of curvature for inner pocket I is between 0.1 mm and 1 mm. Higher temperatures of the diamond substrate may be more readily achieved in a configuration where the diamond substrate is elevated on the sample holder 700a. Plasma focusing occurs when a protruding sample holder geometry concentrates the plasma discharge at its outer boundary. The aspect ratio of holder height to its diameter defines the degree of concentration. This may be related to the growth temperature and doping efficiency. To control focusing effects at edged geometries, rounded corners may be used with precise radii of curvature to minimize material ablation.

The configurations in FIGS. 7A-C may affect diamond growth as they define the plasma discharge in the vicinity of the diamond surface and also the substrate temperature. This substrate accepting element defines how the substrate and its surface interact with the plasma. With a recessed sample holder geometry the substrate surface may be decoupled from the plasma in a controlled way which in turn allows controls of plasma focusing effects on the substrate surface at microscopic protrusions. In addition, gaseous species impinging on the diamond surface are controlled for a recessed holder geometry. A soft plasma ambient may be advantageous in the growth of ultra-smooth homoepitaxial diamond films. As diamond growth requires continuous supply of carbon to the substrate surface, stagnant gas pockets in the recessed holder are eliminated through incorporation of channels that establish a controlled flow of gaseous species across the substrate surface.

Figure 8:
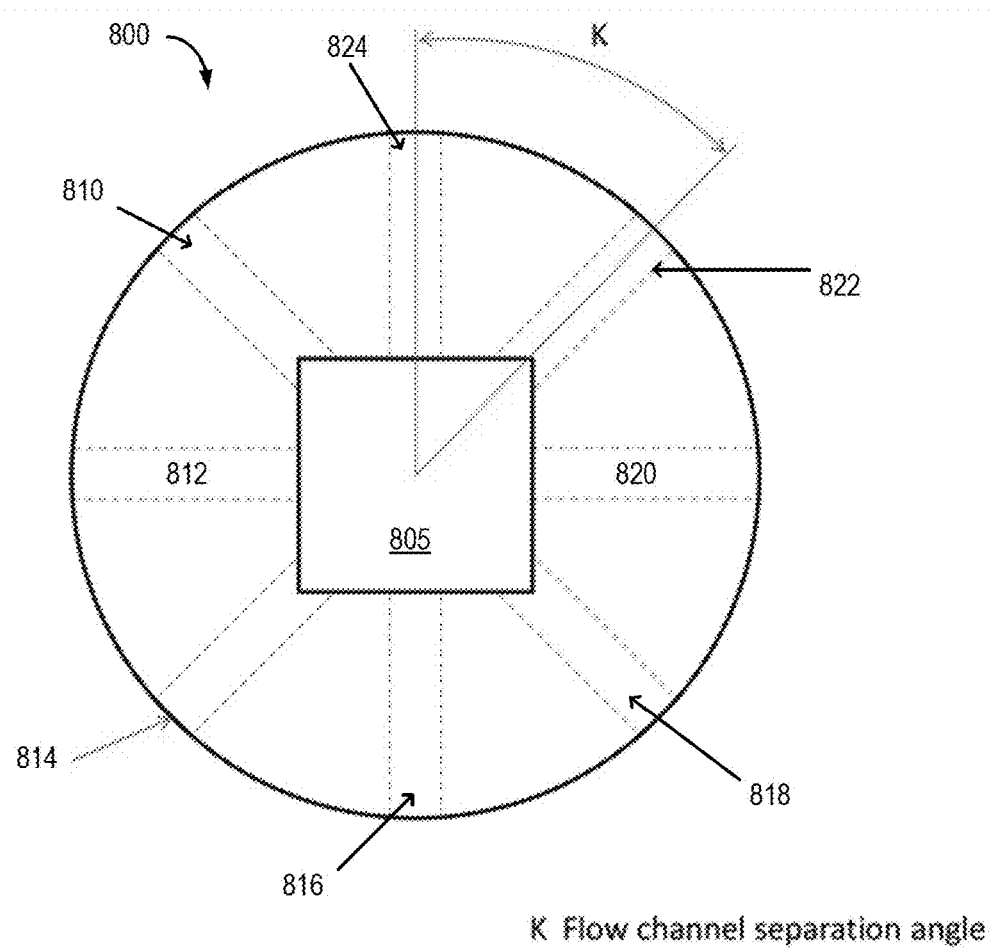
FIG. 8 illustrates flow channel distribution on a sample holder according to the disclosure.

FIG. 8 illustrates flow channel distribution on a sample holder according to the disclosure. The sample holder 800 includes a pocket 805 in the center, which is configured to accept substrate. The sample holder 800 further includes eight flow channels 810, 812, 814, 816, 818, 820, 822, and 824. The separation angle K between channels 822 and 824 is about 45 degrees. In some embodiments, the number of flow channels may ranges between 2 to 10. However, the number of flow channels is not limited by examples in this disclosure.

Figure 9A:
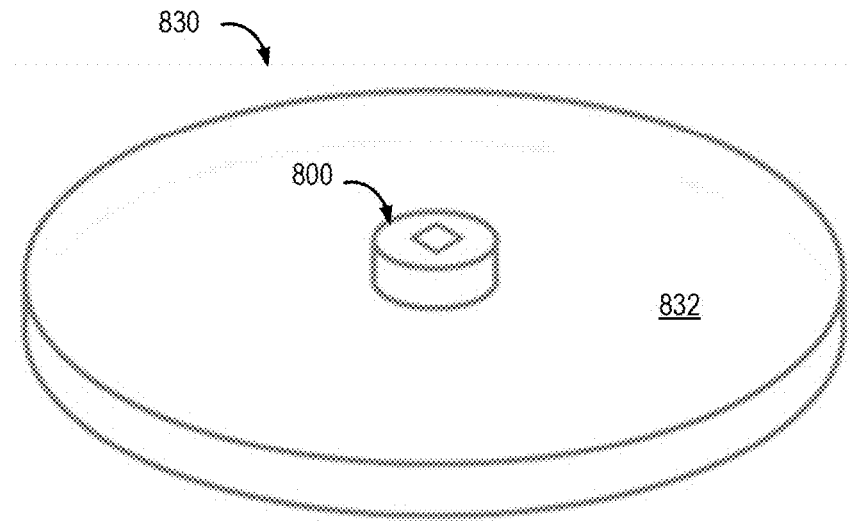
FIG. 9A illustrates a sample stage with a single sample holder according to the disclosure.

FIG. 9A illustrates a sample stage with a single sample holder according to the disclosure. The example structure 830 includes a sample stage 832 and a single sample holder 800 disposed on the sample stage 832.

Figure 9B:
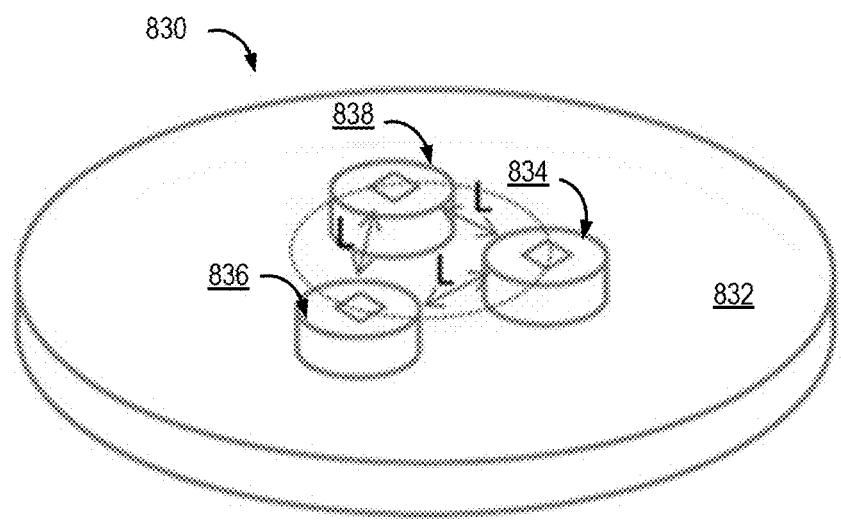
FIG. 9B illustrates a sample stage with multiple sample holders according to the disclosure.

FIG. 9B illustrates a sample stage with multiple sample holders according to the disclosure. The example structure 830 includes three sample holders 834, 836, and 838 disposed on the sample stage 832. The number of sample holders are not limited by the disclosed examples in the disclosure.

Figure 10:
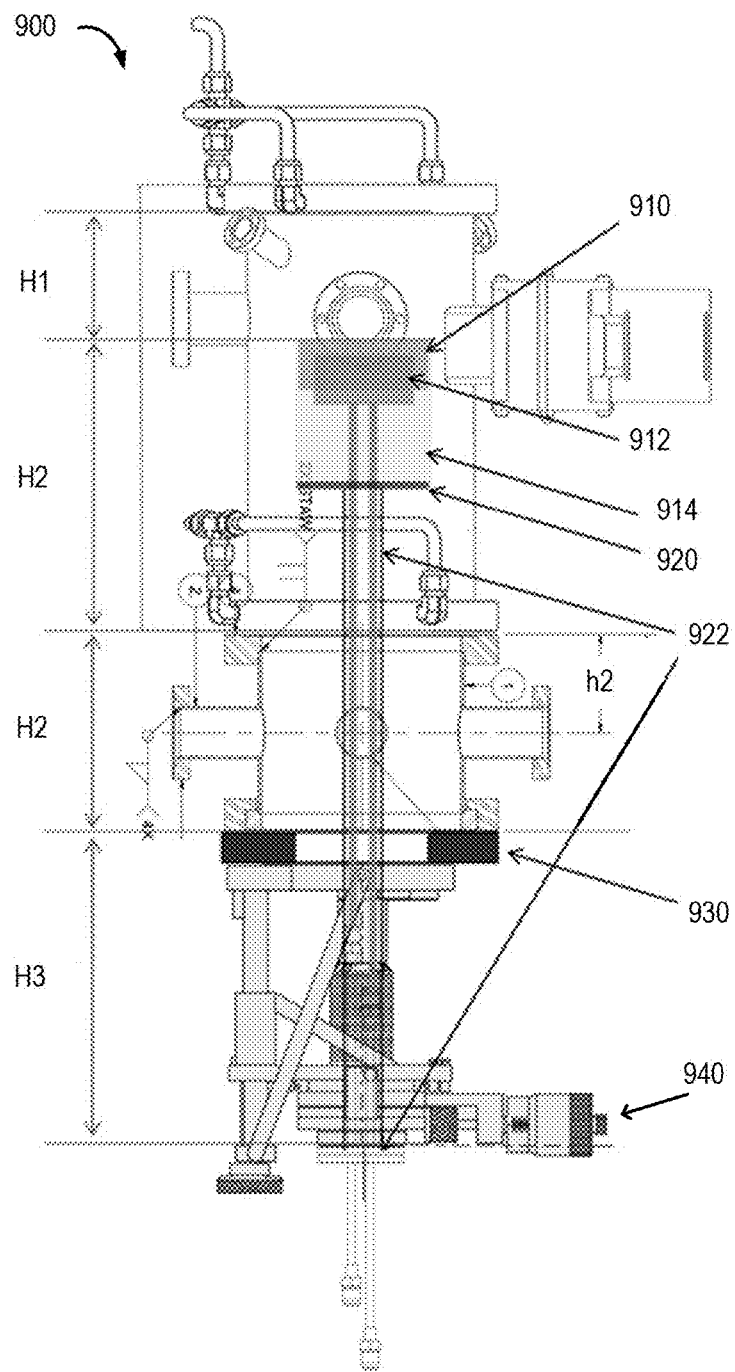
FIG. 10 illustrates a reactor according to the disclosure.

FIG. 10 illustrates a reactor according to the disclosure. The reactor 900 may include a water-cooled support on an xyz movable stage implemented in a 5 kW CVD reactor. The reactor 900 may include a cover 910 that at least partially covers a fluid container 912. The fluid container 912 may be a water block. The cover 910 and fluid container 912 may be disposed in a choke 914, which is disposed on a support disk 920.

The reactor 900 may further include support 922 for the support disk 920. The support 922 may connect to a flange at the bottom of the reactor. The reactor further includes zero reducer flange 930 at least partially surrounding the support 922. The reactor 900 may also include a manipulator 940 around the bottom of the reactor 900.

Here, a novel growth process has been developed for phosphorus incorporation for n-type doping of diamond with (100) and related surface orientation. This growth mode can be obtained with a growth system that allows improved thermal management of the diamond substrate. With electronic grade n-type (100) diamond, discrete semiconductors for power electronics, radiation detectors and UV optoelectronics could be prepared more economically.

The disclosed pulsed deposition mode allows efficient doping of the (100) oriented diamond surface. This feature may be improved by utilization of a water-cooled growth reactor, sample stage and a sample holder configuration for controlled thermal management of the substrate. Compared to electronic grade n-type diamond prepared on (111) oriented diamond, the disclosed method requires a less elaborate processing resulting in lower cost and larger substrates.

The disclosed methods overcome the challenge for the growth of (100) phosphorus doped diamond its surface is polished at an angle, e.g. toward the (110) direction, up to tens of degrees. However, these off-axis plates require more elaborate preparation.

Although the invention has been described in considerable detail with reference to certain embodiments, one skilled in the art will appreciate that the present invention may be practiced by other than the described embodiments, which have been presented for purposes of illustration and not of limitation. Therefore, the scope of the appended claims should not be limited to the above description contained herein.

What is claimed is:

1. An apparatus, comprising:
a base comprising a water-block and a cover that at least partially covers the water-block;
a sample stage disposed on the base; and
a sample holder disposed on the sample stage and comprising a pocket, the sample holder having at least one sidewall comprising an inner edge and an outer edge, with the inner edge of the at least one sidewall laterally bounding an upper portion of the pocket and a lower portion of the pocket, wherein the lower portion of the pocket is arranged below the upper portion of the pocket and is configured to accept a diamond substrate;
wherein the inner edge of the at least one sidewall defines at least one inlet opening in the upper portion of the pocket, and the outer edge of the at least one sidewall defines at least one outlet opening;
wherein the sample holder comprises at least one flow channel extending through the at least one sidewall, and the at least one flow channel extends from the at least one inlet opening to the at least one outlet opening.

2. The apparatus of claim 1, wherein the cover comprises at least one of the following: molybdenum, tantalum, tungsten, molybdenum carbides, tantalum carbides, and tungsten carbides with an optional diamond coating.

3. The apparatus of claim 1, further comprising a plurality of thermal interfaces that are adjusted to achieve a preset temperature for diamond growth.

4. The apparatus of claim 1, wherein the sample holder is configured to fully recess the diamond substrate in the pocket.

5. The apparatus of claim 1, wherein the at least one flow channel extends radially outward from the pocket and is configured to establish a controlled flow of gaseous species across an upper surface of the diamond substrate.

6. The apparatus of claim 5, wherein for each flow channel of the at least one flow channel, the inlet opening is arranged at an elevation higher than the outlet opening, with the flow channel being angled away from horizontal at an angle within a range of between 0.1° and 45°.

7. The apparatus of claim 1, further comprising:
an inlet pipe that provides cold water to the water-block; and
an outlet pipe that removes warm water from the water-block.

8. The apparatus of claim 7, further comprising one or more pumps configured to adjust flow rates of cold water and warm water in the inlet pipe and the outlet pipe.

9. The apparatus of claim 1, wherein the sample stage comprises a circular stage that is separated from the base by one or more spacers.

10. An apparatus, comprising:
a base comprising a fluid container and a cover that at least partially covers the fluid container;
a sample stage holder disposed on the base, the sample stage holder comprising a sample holder having a pocket, the sample holder defining at least one sidewall comprising an inner edge and an outer edge, with the inner edge of the at least one sidewall laterally bounding an upper portion of the pocket and a lower portion of the pocket, wherein the lower portion of the pocket is arranged below the upper portion of the pocket and is configured to accept a diamond substrate; and
a thermal interface between the base and the sample stage holder;
wherein the inner edge of the at least one sidewall defines at least one inlet opening in the upper portion of the pocket, and the outer edge of the at least one sidewall defines at least one outlet opening; and
wherein the sample holder comprises at least one flow channel extending through the at least one sidewall, and the at least one flow channel extends from the at least one inlet opening to the at least one outlet opening.

11. The apparatus of claim 10, wherein the cover, sample stage holder, and sample holder comprise: molybdenum, tantalum, tungsten, their carbides or a combination of these with an optional diamond coating.

12. The apparatus of claim 10, further comprising a second thermal interface disposed at least partially between the fluid container and the cover.

13. The apparatus of claim 10, wherein the sample holder is configured to fully recess the diamond substrate in the pocket.

14. The apparatus of claim 10, wherein the at least one flow channel extends radially outward from the pocket and is configured to establish a controlled flow of gaseous species across an upper surface of the diamond substrate.

15. The apparatus of claim 14, wherein for each flow channel of the at least one flow channel, the inlet opening is arranged at an elevation higher than the outlet opening, with the flow channel being angled away from horizontal at an angle within a range of between 0.1° and 45°.

16. The apparatus of claim 10, further comprising:
an inlet pipe that provides cold water to the fluid container; and
an outlet pipe that removes warm water from the fluid container.

17. The apparatus of claim 10, wherein the sample stage holder comprises a circular stage that is separated from the base by one or more spacers.

18. A plasma enhanced chemical vapor deposition (PECVD) reactor, comprising:
a chamber surrounded at least partially by a reactor wall;
a base disposed in the chamber, the base comprising a fluid container and a cover that at least partially covers the fluid container;
a sample stage holder disposed on the base, the sample stage holder comprising a sample holder having a pocket, the sample holder having at least one sidewall comprising an inner edge and an outer edge, with the inner edge of the at least one sidewall laterally bounding an upper portion of the pocket and a lower portion of the pocket, wherein the lower portion of the pocket is arranged below the upper portion of the pocket and is configured to accept a diamond substrate; and
a thermal interface between the base and the sample stage holder;
wherein the inner edge of the at least one sidewall defines at least one inlet opening in the upper portion of the pocket, and the outer edge of the at least one sidewall defines at least one outlet opening; and
wherein the sample holder comprises at least one flow channel extending through the at least one sidewall, and the at least one flow channel extends from the at least one inlet opening to the at least one outlet opening.

19. The PECVD reactor of claim 18, further comprising:
an inlet pipe that provides cold water to the fluid container; and
an outlet pipe that removes warm water from the fluid container.

20. The PECVD reactor of claim 18, wherein for each flow channel of the at least one flow channel, the inlet opening is arranged at an elevation higher than the outlet opening, with the flow channel being angled away from horizontal at an angle within a range of between 0.1° and 45°.

\* \* \* \* \*